(12) United States Patent
Feng

(10) Patent No.: US 10,993,034 B2
(45) Date of Patent: Apr. 27, 2021

(54) SPEAKER AND METHOD FOR MANUFACTURING SPEAKER

(71) Applicant: AAC Technologies Pte. Ltd., Singapore (SG)

(72) Inventor: Dai Feng, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 0 days.

(21) Appl. No.: 16/527,059

(22) Filed: Jul. 31, 2019

(65) Prior Publication Data
US 2020/0045441 A1 Feb. 6, 2020

(30) Foreign Application Priority Data
Aug. 3, 2018 (CN) .......................... 201810876199.2

(51) Int. Cl.
*H04R 1/06* (2006.01)
*H04R 9/02* (2006.01)
(Continued)

(52) U.S. Cl.
CPC ........... *H04R 9/025* (2013.01); *H04R 31/003* (2013.01); *H05K 1/0277* (2013.01);
(Continued)

(58) Field of Classification Search
CPC ....... H04R 1/06; H04R 9/043; H04R 2400/11
See application file for complete search history.

(56) References Cited

U.S. PATENT DOCUMENTS 7,062,063 B2 * 6/2006 Hansen ................. H04R 7/12
381/152
8,794,374 B2 * 8/2014 Kim ..................... H04R 9/041
181/166
(Continued)

FOREIGN PATENT DOCUMENTS

CN 101360355 A1 2/2009
CN 206894886 B1 1/2018
(Continued)

OTHER PUBLICATIONS

1st Office Action dated Dec. 30, 2019 by SIPO in related Chinese Patent Application No. 201810876199.2 (8 Pages).

*Primary Examiner* — Ryan Robinson
(74) *Attorney, Agent, or Firm* — W&G Law Group LLP

(57) ABSTRACT

The present disclosure provides a speaker including a housing, a vibration unit received in the housing, a magnetic circuit unit, flexible circuit boards, and conductive terminals. The housing includes an upper cover and a holder. The housing includes an upper cover and a holder. The holder includes a holder body and extension portions extending from the holder body. The extension portion includes a groove formed by inwardly recessing from a side surface of the extension portion facing away from the receiving space, and a through hole formed by recessing from a top end of the extension portion and communicating with the groove. One end of the flexible circuit board is received in the groove, and the conductive terminal passes through the through hole to be fixedly connected to the flexible circuit board. The present disclosure also provides a method for manufacturing the speaker.

9 Claims, 9 Drawing Sheets

(51) Int. Cl.
*H05K 1/02* (2006.01)
*H04R 31/00* (2006.01)
*H05K 7/14* (2006.01)

(52) U.S. Cl.
CPC . *H05K 7/1427* (2013.01); *H05K 2201/10083* (2013.01); *H05K 2201/10189* (2013.01)

(56) References Cited

U.S. PATENT DOCUMENTS

| | | | | |
|---|---|---|---|---|
| 9,025,808 | B2* | 5/2015 | Kwon | H04R 9/043 |
| | | | | 381/398 |
| 9,185,477 | B2* | 11/2015 | Kim | H04R 1/06 |
| 9,344,804 | B2* | 5/2016 | Chen | H04R 3/00 |
| 9,832,557 | B2* | 11/2017 | Park | H04R 1/06 |
| 9,838,816 | B2* | 12/2017 | Wang | B29B 11/08 |
| 10,553,191 | B2* | 2/2020 | Shan | G10K 9/122 |
| 10,575,077 | B2* | 2/2020 | Yang | H04R 1/025 |
| 2007/0030994 | A1* | 2/2007 | Ando | H04R 9/06 |
| | | | | 381/409 |
| 2011/0075880 | A1* | 3/2011 | Kamimura | H04R 9/10 |
| | | | | 381/413 |
| 2018/0227667 | A1* | 8/2018 | Kim | H04R 1/42 |
| 2018/0302724 | A1* | 10/2018 | Li | H04R 7/12 |
| 2020/0045446 | A1* | 2/2020 | Feng | H04R 7/127 |

FOREIGN PATENT DOCUMENTS

| | | | | |
|---|---|---|---|---|
| WO | WO-2013187718 | A1 * | 12/2013 | H04R 3/08 |
| WO | WO-2018145414 | A1 * | 8/2018 | H04R 9/02 |

* cited by examiner

SPEAKER AND METHOD FOR MANUFACTURING SPEAKER

TECHNICAL FIELD

The present disclosure relates to the acoustoelectric field, and in particular, to a speaker and a method for manufacturing the speaker.

BACKGROUND

In order to adapt to the miniaturizing and multi-functional development of various audio devices and information communication devices, a speaker used in these devices is required to be more miniaturized correspondingly, and to cooperate with other components around the speaker more compactly.

In the related art, a conductive terminal of the speaker includes a flexible circuit board and a conductive member. In a process of manufacturing the speaker, the flexible circuit board is first welded to a holder, and then the conductive member is welded to the flexible circuit board. When the manufacturing method is adopted, it is necessary to provide two welding pad positions, which wastes the space and does not meet the needs of miniaturization of the speaker.

Therefore, it is urgent to provide a speaker and a method for manufacturing the speaker to solve the above technical problems.

BRIEF DESCRIPTION OF DRAWINGS

Many aspects of the exemplary embodiment can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DESCRIPTION OF EMBODIMENTS

The present invention will be further illustrated with reference to the accompanying drawings and the embodiments.

Embodiment 1

Figure 1:
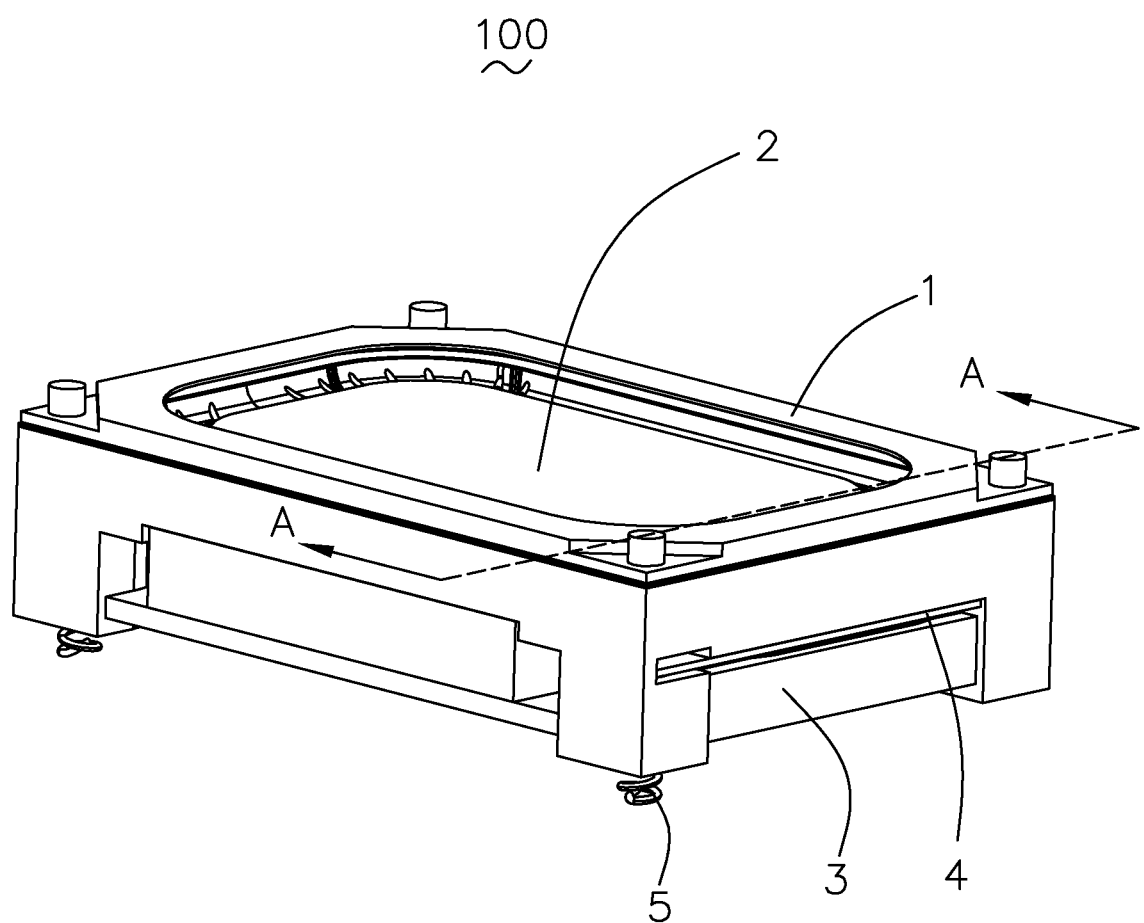
FIG. 1 is a stereoscopic structural schematic diagram of a speaker according to Embodiment 1 of the present disclosure.
Figure 2:
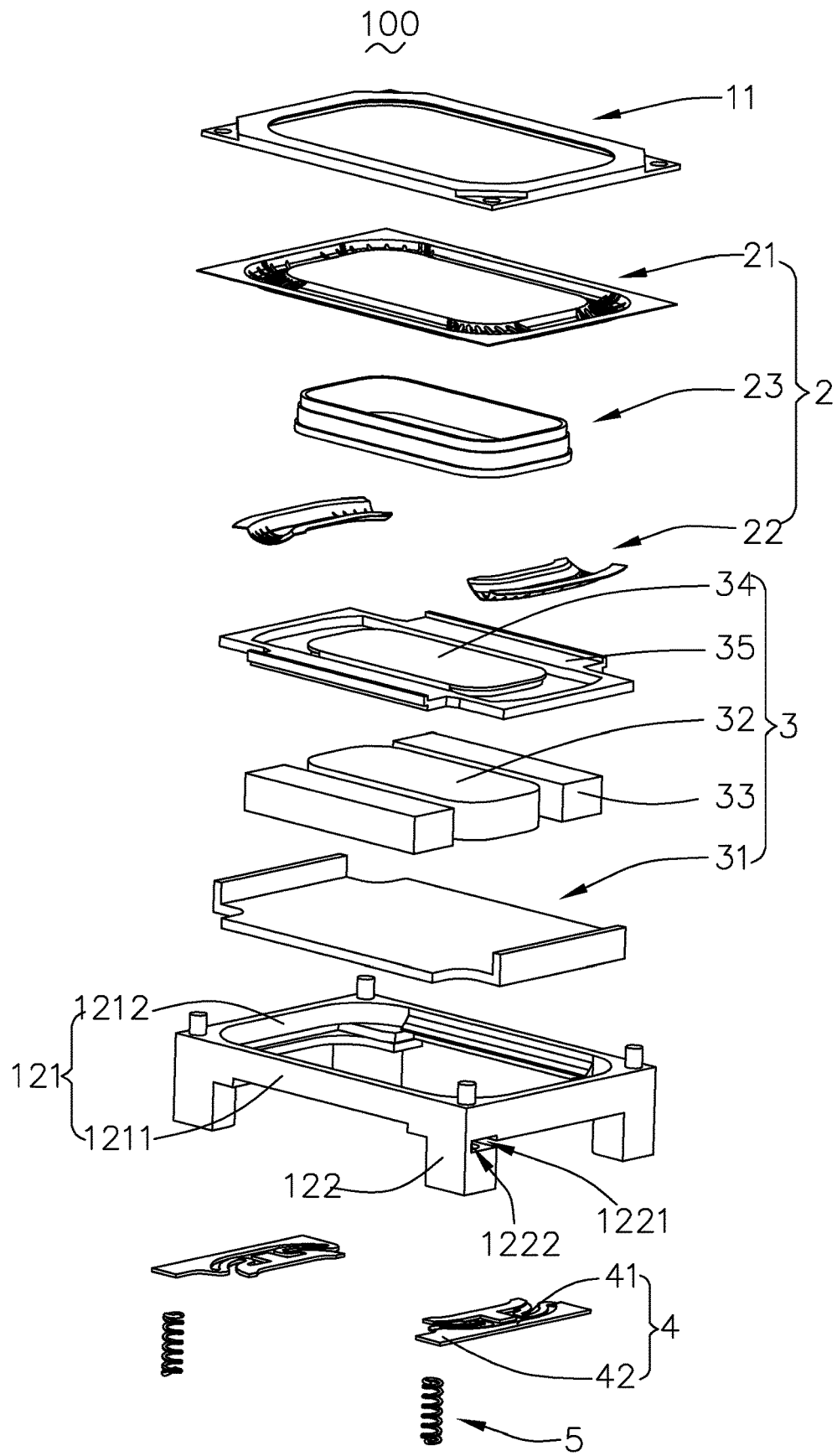
FIG. 2 is an exploded structural schematic diagram of the speaker as shown in FIG. 1.

With reference to FIG. 1 and FIG. 2, the present disclosure provides a speaker 100. The speaker 100 includes a housing 1 having a receiving space, a vibration unit 2 received in the receiving space, a magnetic circuit unit 3 configured to drive the vibration unit 2 to vibrate and emit sound, flexible circuit boards 4 configured to elastically support the vibration unit 2, and conductive terminals 5 connected to the flexible circuit boards 4.

The housing 1 includes an upper cover 11 and a holder 12 assembled with the upper cover 11 to form the receiving space. The holder 12 includes a holder body 121 and extension portions 122 extending from the holder body 121 in a direction facing away from the vibration unit 2. The upper cover 11 covers a side of the holder body 121 facing away from the extension portions 122.

The holder body 121 has a shape of a rectangular frame, and includes two long side walls 1211 arranged in parallel, and two short side walls 1212 respectively arranged at two ends of each long side wall 1211 and connecting the two long side walls 1211. The two short side walls 1212 are also arranged in parallel. The long side walls 1211 and the short side walls 1212 are connected end to end to form an integral structure of the holder body 121.

A number of the extension portions 122 is four, and every two of the four extension portions 122 are symmetrically arranged at the corners of the holder body 121, that is, each extension portion 122 is located at a joint of the long side wall 1211 and the short side wall 1212.

The extension portion 122 includes a groove 1221 formed by inwardly recessing from a side surface of the extension portion 122 facing away from the receiving space, and a through hole 1222 formed by recessing from a top end of the extension portion 122 and communicating with the groove 1221.

In a specific example, a number of the grooves 1221 is two, and the two grooves 1221 are provided at the two ends of the long side wall 1211, respectively.

In a specific example, a number of the through holes 1222 is also two, and the through holes 1222 are arranged corresponding to the grooves 1221. That is, the two grooves 1221 are also symmetrically arranged with respect to the long side wall 1211. Further, the through hole 1222 is a cylindrical hole, and the through hole 1222 is arranged to directly face the groove 1221.

The vibration unit 2 is configured to vibrate and emit sound. For example, the vibration unit 2 includes a first diaphragm 21 configured to vibrate and emit sound, a second diaphragm 22 arranged opposite to the first diaphragm 21, and a voice coil 23 fixed and held at the first diaphragm 21 and configured to drive the first diaphragm 21 to vibrate and emit sound. The first diaphragm 21 is configured to vibrate and emit sound, and the second diaphragm 22 is connected to the flexible circuit board 4 and elastically supports the voice coil 23, and ti also can prevent the polarization of the first diaphragm 21, thereby improve the acoustic performance of the speaker 100.

A magnetic circuit unit 3 is configured to drive the vibration unit 2 to vibrate and emit sound. For example, the magnetic circuit unit 3 includes a yoke 31 fixedly connected to the holder body 121, a main magnet 32 assembled at the center of the yoke 31, auxiliary magnets 33 assembled on the yoke 31 and surrounding the main magnet 32 to form magnetic gaps, a main pole core 34 attached onto the main magnet 32, and an auxiliary pole core 35 attached to the auxiliary magnets.

Figure 3:
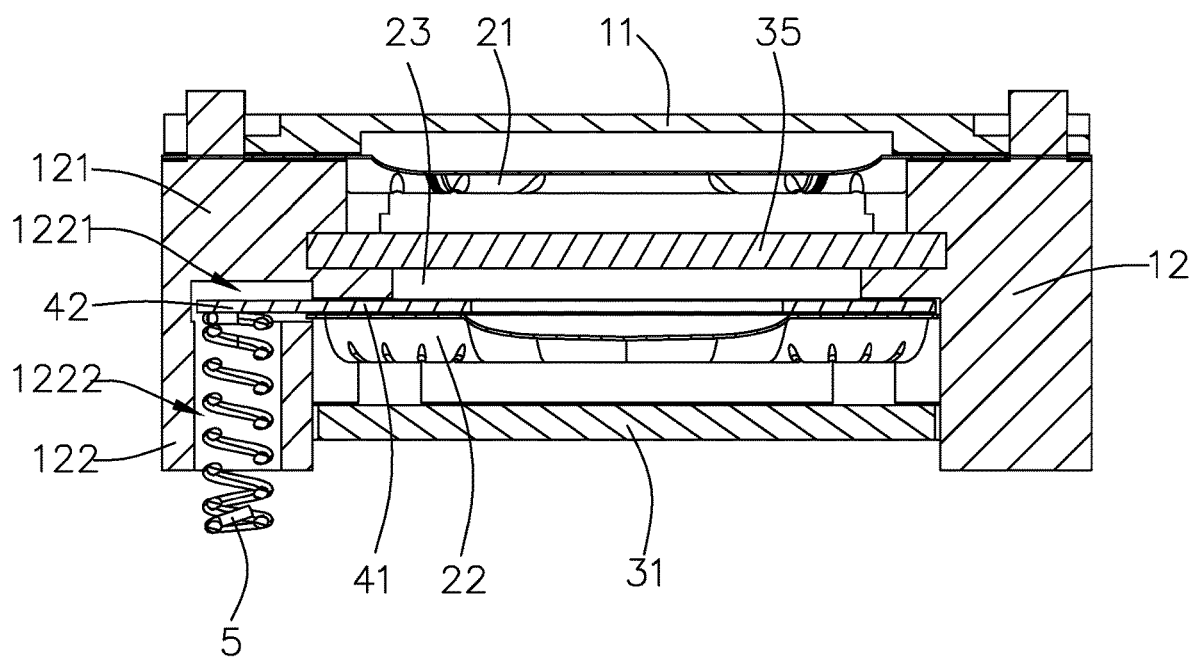
FIG. 3 is a cross-sectional view of the speaker taken along line A-A as shown in FIG. 1.

With reference to FIG. 3, the flexible circuit board 4 includes a body portion 41 and a welding pad portion 42 extending from the body portion 41 in a direction facing away from the body portion 41. An outer edge of the body portion 41 is fixedly connected to the short side walls 1212, and an inner edge thereof is connected to the vibration unit 2. For example, one end of the body portion 41 is interposed between the voice coil 23 and the second diaphragm 22, and the other end thereof is interposed between the short side wall 1212 and the second diaphragm 22. The flexible circuit board 4 and the second diaphragm 22 are assembled together to form an elastic support member, which is configured to elastically support the voice coil 23.

The welding pad portion 42 is received in the groove 1221, so as to embed the flexible circuit board 4 in the holder 12. The number of the flexible circuit boards 4 is two, and the two flexible circuit boards 4 are symmetrically arranged with respect to the holder body 121.

The conductive terminal 5 cooperates with the flexible circuit board 4 to realize an electrical connection between the voice coil 23 and an external circuit. In an embodiment, the conductive terminal 5 is a metal spring.

One end of the conductive terminal 5 passes through the through hole 1222 to be fixedly connected to the welding pad portion 42. On the one hand, the movement of the conductive terminal 5 along the height direction of the holder 12 is limited, and on the other hand, the movement of the flexible circuit board 4 along a direction of the long side wall 1211 is limited, and the structure is simple.

The conductive terminal 5 and the welding pad portion 42 are fixedly connected by welding.

It can be understood that, the conductive terminal 5 and the welding pad portion 42 can achieve a relative fixation of the conductive terminal 5 and the flexible circuit board 4 only by one-time welding, In this way, a number of times of the welding of the speaker 100 during the manufacturing process, and a number of welding pads during the welding process can be reduced at the same time. Therefore, the space can be saved, and the miniaturization requirement of the speaker 100 can be satisfied.

Embodiment 2

Figure 4:
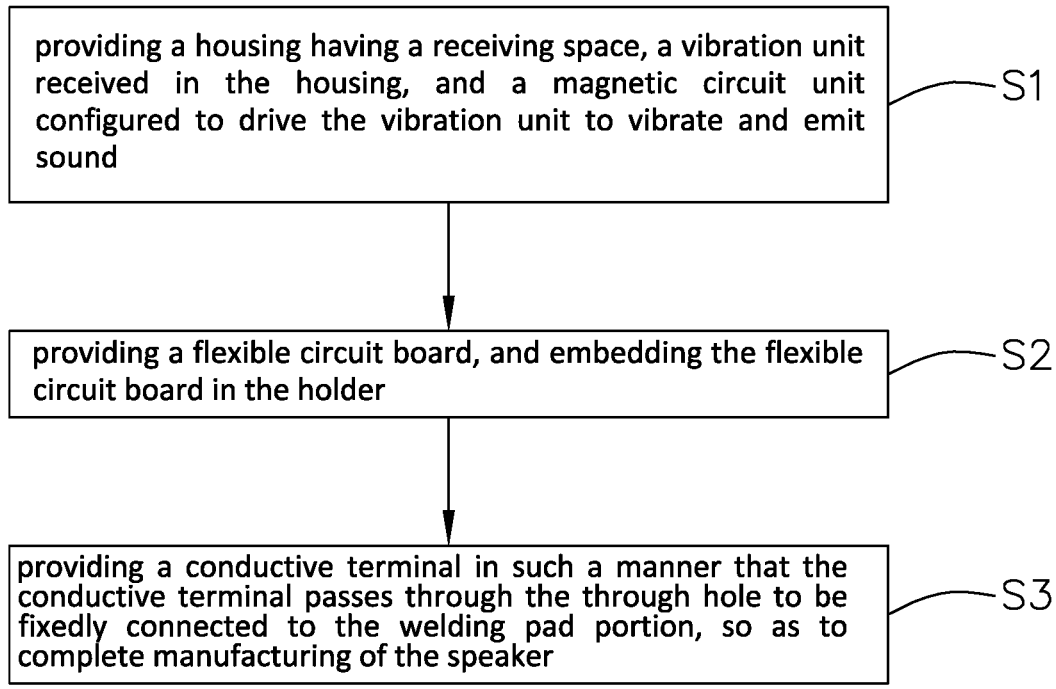
FIG. 4 is a flowchart of a method for manufacturing a speaker according to Embodiment 2 of the present disclosure.
Figure 5:
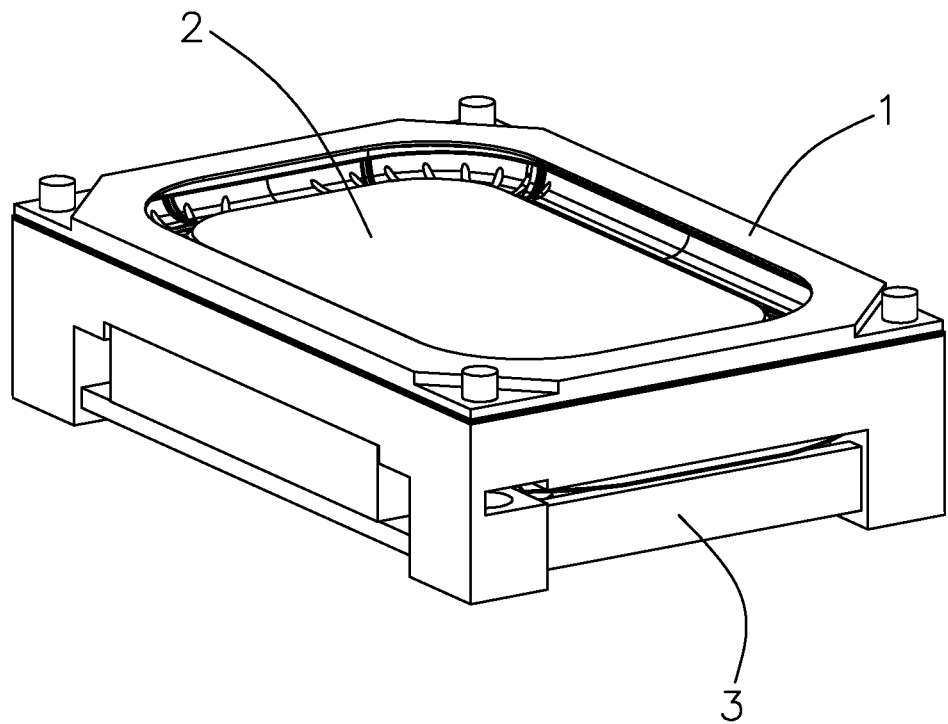
FIG. 5 is a structural schematic diagram of the speaker after step S1 is completed according to Embodiment 2 of the present disclosure.

With reference to FIG. 4 and FIG. 5, the present disclosure also provides a method for manufacturing the speaker 100, including the following steps:

S: providing a housing 1 having a receiving space, a vibration unit 2 received in the receiving space, and a magnetic circuit unit 3 configured to drive the vibration unit 2 to vibrate and emit sound.

Figure 6:
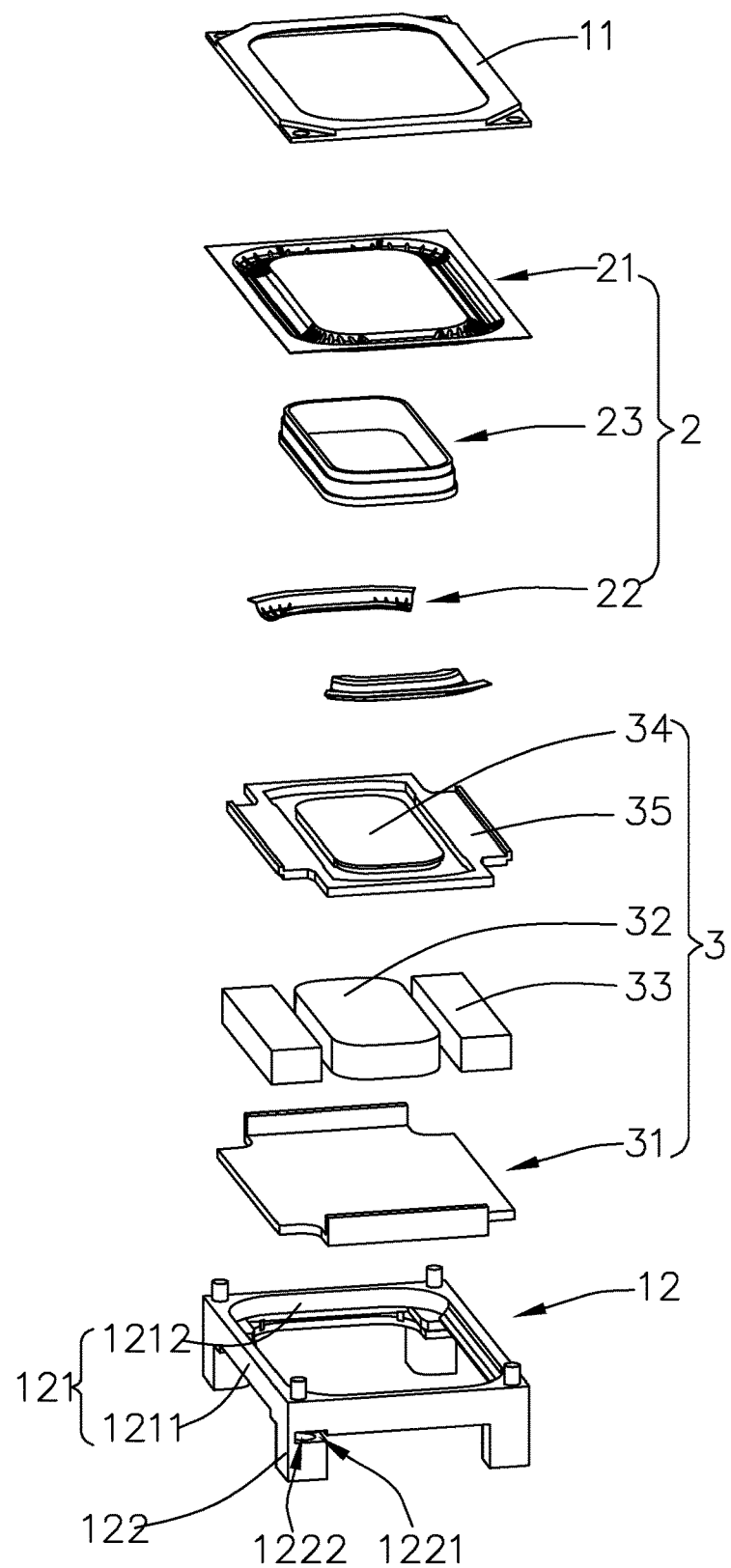
FIG. 6 is an exploded structural schematic diagram of the speaker as shown in FIG. 5.
Figure 7:
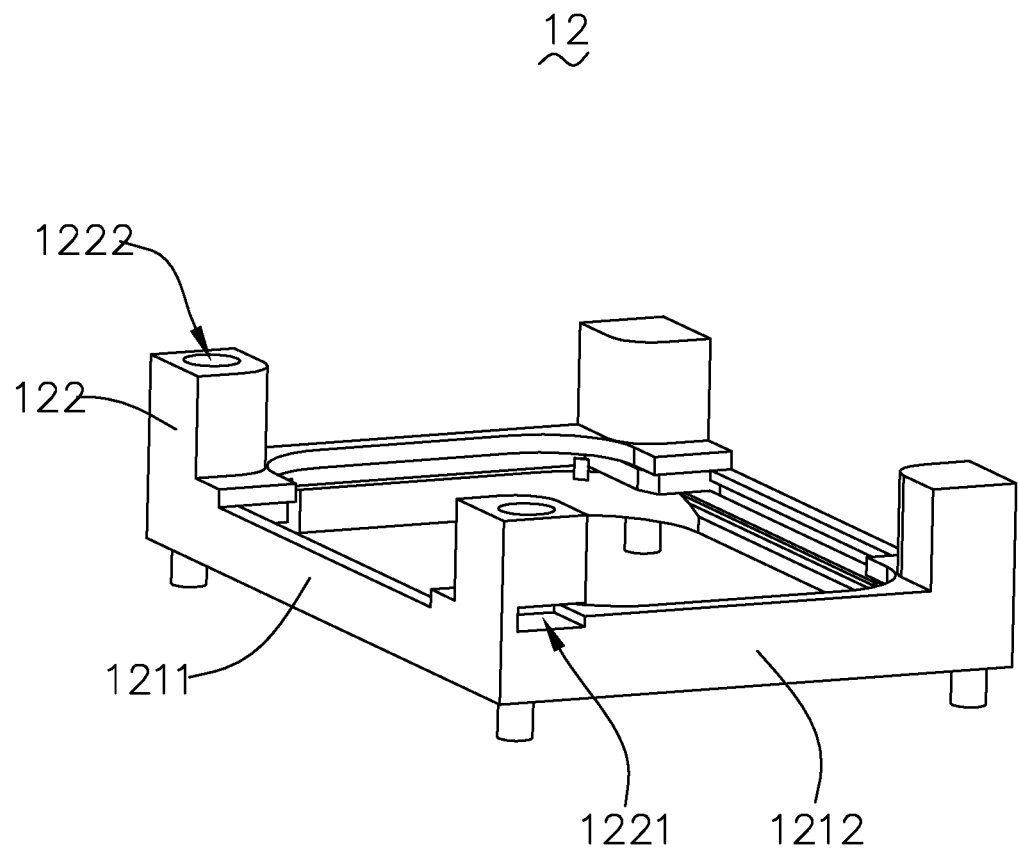
FIG. 7 is a stereoscopic structural schematic diagram of a holder at an angle as shown in FIG. 5.

With reference to FIG. 6 and FIG. 7, the housing 1 includes an upper cover 11 and a holder 12 assembled with the upper cover 11 to form the receiving space. The housing 1 is configured to accommodate and protect other components of the speaker.

The holder 12 has a shape of a rectangular frame, and includes a holder body 121 and extension portions 122 extending from the holder body 121 in a direction facing away from the vibration unit 2, and the upper cover 11 covers a side of the holder body 121 facing away from the extension portions 122.

The holder body 121 includes two long side walls 1211 arranged in parallel, and two short side walls 1212 respectively arranged at two ends of one of the two long side walls 1211 and connecting the two long side walls 1211. The two short side walls 1212 are also arranged in parallel. The long side walls 1211 and the short side walls 1212 are connected end to end to form the integral structure of the holder body 121.

The number of the extension portions 122 is four, and every two of the four extension portions 122 are symmetrically arranged at the corners of the holder body 121, that is, each extension portion 122 is located at the joint of the long side wall 1211 and the short side wall 1212.

The extension portion 122 includes a groove 1221 formed by inwardly recessing from a side surface of the extension portion 122 facing away from the receiving space, and a through hole 1222 formed by recessing from a top end of the extension portion 122 and communicating with the groove 1221.

In a specific example, a number of the grooves 1221 is two, and the two grooves 1221 are provided at the same side as the long side wall 1211. That is, the two grooves 1221 are arranged symmetrically with respect to the long side wall 1211.

In a specific example, a number of the through holes 1222 is also two, and the through holes 1222 are arranged corresponding to the grooves 1221. That is, the two grooves 1221 are also arranged symmetrically with respect to the long side wall 1211. Further, the through hole 1222 is a cylindrical hole, and the through hole 1222 is arranged to directly face the groove 1221.

The vibration unit 2 is configured to vibrate and emit sound. For example, the vibration unit 2 includes a first diaphragm 21 configured to vibrate and emit sound, a second diaphragm 22 arranged opposite to the first diaphragm 21, and a voice coil 23 fixed and held at the first diaphragm 21 and configured to drive the first diaphragm 21 to vibrate and emit sound. The first diaphragm 21 is configured to vibrate and emit sound, and the second diaphragm 22 is configured to reinforce the vibration of the first diaphragm 21, and can also prevent the polarization of the first diaphragm 21, thereby improve the acoustic performance of the speaker 100.

A magnetic circuit unit 3 is configured to drive the vibration unit 2 to vibrate and emit sound. For example, the magnetic circuit unit 3 includes a yoke 31 fixedly connected to the holder body 121, a main magnet 32 assembled at the center of the yoke 31, auxiliary magnets 33 assembled on the yoke 31 and surrounding the main magnet 32 to form magnetic gaps, a main pole core 34 attached onto the main magnet 32, and an auxiliary pole core 35 attached to the auxiliary magnet.

S2: Providing flexible circuit boards 4, and fixing the flexible circuit boards 4 on the holder 12.

In a specific example, the flexible circuit board 4 includes a body portion 41 and a welding pad portion 42 extending from the body portion 41 in a direction facing away from the body portion 41. An inner edge of the body portion 41 is connected to the voice coil 23, an outer edge of the body portion 41 is connected to the holder 12, and the welding pad portion 42 is received in the groove 1221.

In an embodiment, the number of the flexible circuit boards 4 is two, and the two flexible circuit boards are symmetrically arranged to space apart from one another.

Figure 8:
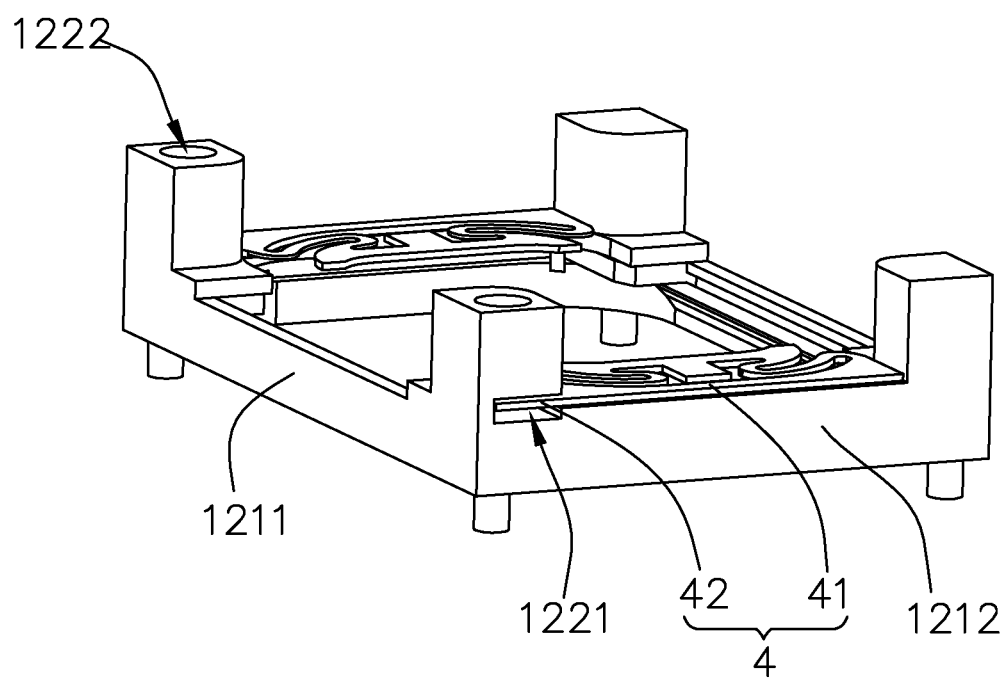
FIG. 8 is a schematic diagram showing a connection structure of the holder and flexible circuit boards according to Embodiment 2 of the present disclosure.

With reference to FIG. 8, for example, the body portion 41 abuts against the short side wall 1212, one end of the body portion 41 is interposed between the voice coil 23 and the second diaphragm 22, and the other end thereof is interposed between the holder body 121 and the second diaphragm 22. The flexible circuit board 4 and the second diaphragm 22 are assembled to form an elastic support member, which is configured to elastically support the voice coil 23.

S3: providing conductive terminals 5 in such manner that the conductive terminal 5 pass through the through hole 1222 to be fixedly connected to the welding pad portion 42, so as to complete the manufacturing of the speaker 100.

Figure 9:
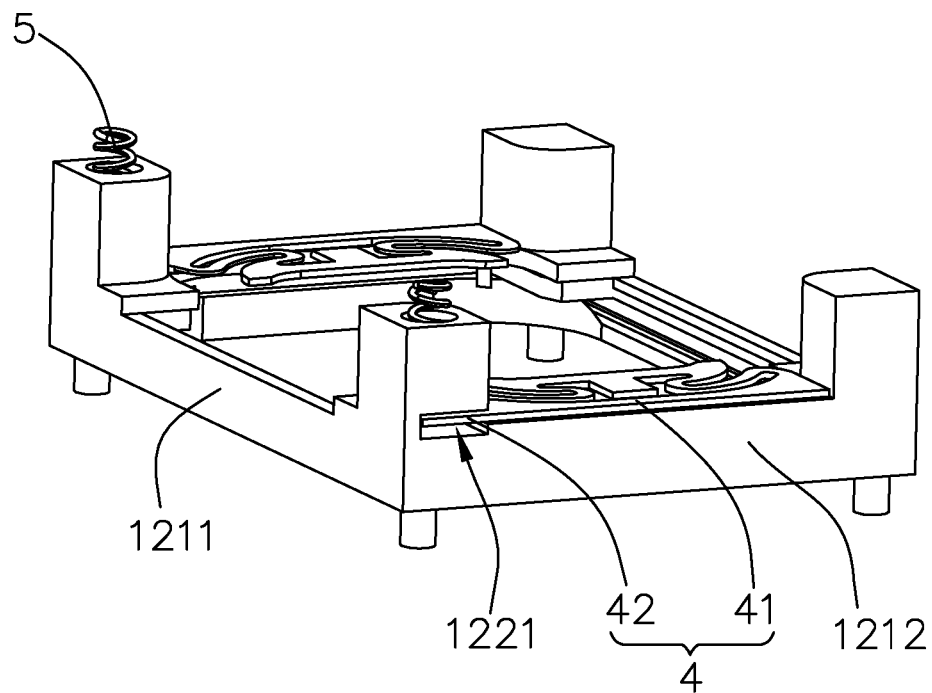
FIG. 9 is a schematic diagram showing a connection structure of the holder, the flexible circuit boards and conductive terminals according to Embodiment 2 of the present disclosure.

With reference to FIG. 9, the conductive terminal 5 cooperates with the flexible circuit board 4 to realize an electrical connection between the voice coil 23 and an external circuit. In an embodiment, the conductive terminal 5 is a metal spring.

The conductive terminal 5 and the welding pad portion 42 are fixedly connected by welding. For example, one end of the conductive terminal 5 passes through the through hole 1222 to be fixedly connected to the welding pad portion 42. On the one hand, the movement of the conductive terminal 5 along the height direction of the holder 12 is limited, and on the other hand, the movement of the flexible circuit board 4 along a direction of the long side wall 1211 is limited, and the structure is simple.

It can be understood that the conductive terminal 5 and the welding pad portion 42, by merely one connection, can achieve a relative fixation of the conductive terminal 5 and the flexible circuit board 4. In this way, a number of times of the welding of the speaker 100 during the manufacturing process, and a number of welding pads during the welding process can be reduced at the same time. Therefore, the space can be saved, and the miniaturization requirement of the speaker 100 can be satisfied.

Compared with the related art, in the method for manufacturing the speaker provided by the present disclosure, the through holes 1222 and the grooves 1221 communicating with the through holes 1222 are provided in the extension portions 122 of the holder 21, one end of the flexible circuit board 4 is received in the groove 1221, the conductive terminal 5 directly passes through the through hole 1222 to be fixedly connected with the flexible circuit board 4, so that a fixed connection between the flexible circuit board 4 and the conductive terminal 5 can realized by only one-time welding. Therefore, the number of welding processes and the number of the welding pads used in the manufacturing process of the speaker 100 can be reduced at the same time, thereby further reducing the volume of the speaker 100. The speaker 100 manufactured with the said method for manufacturing the speaker has a more miniaturized structure.

It should be noted that, the above are merely embodiments of the present invention. Any improvement made by those skilled in the art without departing from the inventive concept of the present invention shall fall within the protection scope of the present invention.

What is claimed is:

1. A speaker, comprising:
   a housing having a receiving space;
   a vibration unit received in the housing;
   a magnetic circuit unit configured to drive the vibration unit to vibrate and emit sound;
   a flexible circuit board configured to elastically support the vibration unit; and
   a conductive terminal connected to the flexible circuit board and configured to electrically connect the vibration unit to an external circuit,
   wherein the housing comprises an upper cover, and a holder assembled with the upper cover to form the receiving space, the holder comprising a holder body and an extension portion extending from the holder body in a direction facing away from the upper cover,
   the extension portion comprises a groove formed by inwardly recessing from a side surface of the extension portion facing away from the receiving space, and a through hole formed by recessing from a top end of the extension portion and communicating with the groove, and
   the flexible circuit board has one end embedded in the groove, and the conductive terminal passes through the through hole to be fixedly connected to the flexible circuit board;
   wherein the flexible circuit board comprises a body portion, and a welding pad portion extending from the body portion in a direction facing away from the body portion,
   an outer edge of the body portion is fixedly connected to the holder, an inner edge of the body portion is connected with the vibration unit, and the welding pad portion is received in the groove.

2. The speaker as described in claim 1, wherein the conductive terminal and the welding pad portion are fixedly connected by welding.

3. The speaker as described in claim 1, wherein four extension portions are provided, and every two of the four extension portions are symmetrically arranged at corners of the holder body.

4. The speaker as described in claim 3, wherein the holder body has a rectangular frame structure, and comprises two long side walls arranged in parallel, and two short side walls being each arranged at two ends of one of the two long side walls and connecting the two long side walls, and
   the four extension portions are each formed at joints of the two long side walls and the two short side walls.

5. The speaker as described in claim 4, wherein two grooves are provided, and each end of one of the two long side walls is provided with one of the two grooves.

6. The speaker as described in claim 5, wherein two through holes are provided, and the two through holes are arranged to directly face the grooves.

7. A method for manufacturing a speaker, comprising steps of:
   providing a housing having a receiving space, a vibration unit received in the housing, and a magnetic circuit unit configured to drive the vibration unit to vibrate and emit sound, wherein the housing comprises an upper cover and a holder assembled with the upper cover to form the receiving space, and the holder comprises a holder body and an extension portion extending from the holder body in a direction facing away from the upper cover, the extension portion comprises a groove formed by inwardly recessing from a side surface of the extension portion facing away from the receiving space, and a through hole formed by recessing from a top end of the extension portion and communicating with the groove;
   providing a flexible circuit board, the flexible circuit board comprising a body portion and a welding pad portion extending from the body portion in a direction facing away from the body portion, and embedding the flexible circuit board in the holder to connect the body portion with the vibration unit, wherein the welding pad portion is received in the groove; and
   providing a conductive terminal in such a manner that the conductive terminal passes through the through hole to be fixedly connected to the welding pad portion, so as to complete manufacturing of the speaker.

8. The method for manufacturing a speaker as described in claim 7, wherein the conductive terminal and the welding pad portion are fixedly connected by welding.

9. The method for manufacturing a speaker as described in claim 7, wherein the through hole is arranged to directly face the groove.

* * * * *